US012663187B2

(12) United States Patent (10) Patent No.: US 12,663,187 B2

Ha et al. (45) Date of Patent: Jun. 23, 2026

(54) CHEMICAL LIQUID SUPPLY MODULE AND SUBSTRATE TREATING APPARATUS INCLUDING THE SAME

(71) Applicant: SEMES CO., LTD., Chungcheongnam-do (KR)

(72) Inventors: Dogyeong Ha, Chungcheongnam-do (KR); Jaewon Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 448 days.

(21) Appl. No.: 18/530,368

(22) Filed: Dec. 6, 2023

(65) Prior Publication Data

US 2024/0198371 A1 Jun. 20, 2024

(30) Foreign Application Priority Data

Dec. 14, 2022 (KR) ........................ 10-2022-0175291

(51) Int. Cl.
F24V 40/00 (2018.01)
B05B 1/24 (2006.01)
(Continued)

(52) U.S. Cl.
CPC ............... F24V 40/00 (2018.05); B05B 1/24 (2013.01); B05B 12/10 (2013.01); B05B 15/25 (2018.02);
(Continued)

(58) Field of Classification Search
CPC ....... F04D 15/0263; B05B 12/10; B05B 1/25; H10P 72/0602; H10P 72/0604; H10P 72/0414; B08B 3/104; F24V 40/00
See application file for complete search history.

(56) References Cited

U.S. PATENT DOCUMENTS 4,798,176 A 1/1989 Perkins
10,814,251 B2 10/2020 Negoro
(Continued)

FOREIGN PATENT DOCUMENTS

CN 104681470 A * 6/2015 ............. H10P 72/00
KR 10-2012-0127203 A 11/2012
(Continued)

OTHER PUBLICATIONS

English machine translation of CN104681470 (Year: 2015).*
Office Action issued in corresponding KR Patent Application No. 10-2022-0175291, dated Feb. 5, 2024, pp. 1-4.

*Primary Examiner* — Scott W Dodds
(74) *Attorney, Agent, or Firm* — Carter, DeLuca & Farrell LLP

(57) ABSTRACT

Disclosed are a chemical liquid supply module, and a substrate treating apparatus including the same. The chemical liquid supply module includes: a chemical liquid tank having a receiving space defined therein capable of receiving therein chemical liquid; a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank; a pump unit installed at the chemical liquid circulating line and configured to control a flow rate and a pressure of the chemical liquid flowing in the chemical liquid circulating line; and a controller configured to apply a control signal to the pump unit to control a revolution per minute (RPM) of the pump unit.

20 Claims, 6 Drawing Sheets

(51) Int. Cl.

| | |
|---|---|
| *B05B 12/10* | (2006.01) |
| *B05B 15/25* | (2018.01) |
| *B08B 3/10* | (2006.01) |
| *F04D 15/02* | (2006.01) |
| *H10P 72/00* | (2026.01) |
| *B05B 12/00* | (2018.01) |
| *B05B 12/08* | (2006.01) |
| *B05B 15/40* | (2018.01) |

(52) U.S. Cl.
    CPC .......... *B08B 3/104* (2013.01); *F04D 15/0263*
        (2013.01); *H10P 72/0402* (2026.01); *H10P*
        *72/0414* (2026.01); *H10P 72/0602* (2026.01);
            *H10P 72/0604* (2026.01); *B05B 12/006*
        (2013.01); *B05B 12/085* (2013.01); *B05B*
        *15/40* (2018.02); *B08B 2203/007* (2013.01)

(56)                References Cited

U.S. PATENT DOCUMENTS

2006/0254619 A1*  11/2006  Bigott ..................... B08B 3/102
                                                134/186
2014/0060588 A1*   3/2014  Sporer ..................... B08B 3/14
                                                134/110

2016/0193986 A1*   7/2016  Trager .................... B60S 1/487
                                                239/130
2019/0057884 A1    2/2019  Cho et al.
2019/0240597 A1*   8/2019  Negoro ............. B01D 19/0005
2022/0187721 A1    6/2022  Sasa et al.

FOREIGN PATENT DOCUMENTS

| | | | |
|---|---|---|---|
| KR | 10-2019-0019229 | A | 2/2019 |
| KR | 10-2019-0095887 | A | 8/2019 |
| KR | 10-2021-0126541 | A | 10/2021 |
| KR | 10-2022-0085075 | A | 6/2022 |
| WO | 89/01114 | A1 | 2/1989 |
| WO | 2016/141649 | A1 | 9/2016 |

* cited by examiner

CHEMICAL LIQUID SUPPLY MODULE AND SUBSTRATE TREATING APPARATUS INCLUDING THE SAME

CROSS-REFERENCE TO RELATED APPLICATION

This application claims priority to and the benefit of Korean Patent Application No. 10-2022-0175291, filed on Dec. 14, 2022, the disclosure of which is incorporated herein by reference in its entirety.

BACKGROUND OF THE DISCLOSURE

1. Field of the Disclosure

The present disclosure relates to a chemical liquid supply module and a substrate treating apparatus. More specifically, the present disclosure relates to a chemical liquid supply module capable of supplying chemical liquid used for treating a substrate to a substrate treating apparatus, and a substrate treating apparatus including the same.

2. Description of the Related Art

To manufacture semiconductor devices or liquid crystal displays, various processes such as photography, etching, ashing, and thin film deposition are performed. In these processes, as a circuit pattern on a substrate becomes finer, device characteristics and a production yield become more sensitive to particles and contaminants. For this reason, a cleaning process to remove the particles and contaminants is performed before or after each of the processes. In this cleaning process, a plurality of chemical processes, a rinsing process, and a drying process may be carried out sequentially within a chamber. While the cleaning process is in progress, clean air flows downwardly into the chamber to discharge the contaminants or particles and fumes produced during the cleaning process to the outside.

During the substrate cleaning process, various types of chemical liquids may be used to remove the contaminants on the substrate, and the chemical liquid may be sprayed onto the substrate through a spray nozzle located on top of the substrate. A chemical liquid supply module equipped with a chemical liquid tank module may heat the chemical liquid to be sprayed from the spray nozzle during the substrate cleaning process to a temperature appropriate for a process condition and then the chemical liquid may be supplied to the spray nozzle of a substrate treating apparatus.

However, this conventional chemical liquid supply module is a bellows pump-based chemical liquid supply apparatus. In this regard, the bellows pump performs left-right reciprocating motion using an air pressure, and thus generates low heat. Thus, an operation of a separate heater to raise the temperature of the chemical liquid is required. This may cause a problem in that the pump and the heater should operate separately to circulate the chemical liquid and raise the temperature of the chemical liquid. Furthermore, the conventional chemical liquid supply module uses a coil-based heat conduction scheme heater. Thus, a response speed is low and a temperature of a liquid contact area is very high, so that bubbles may be produced during the temperature increase depending on a type of the chemical liquid, and a large variation in the temperature control may occur due to the high temperature of the liquid contact area.

SUMMARY OF THE DISCLOSURE

The present disclosure is intended to solve various problems, including the above problems. Thus, a purpose of the present disclosure is to provide a chemical liquid supply module in which a system for circulating the chemical liquid and increasing the temperature of the chemical liquid using a magnetic levitation-type pump is implemented such that an operation of a separate heater to raise the temperature of the chemical liquid is not required, and to provide a substrate treating apparatus including the same.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means illustrated in the claims and combinations thereof.

According to a first aspect of the present disclosure, a chemical liquid supply module includes: a chemical liquid tank having a receiving space defined therein capable of receiving therein chemical liquid; a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank; a pump unit installed at the chemical liquid circulating line and configured to control a flow rate and a pressure of the chemical liquid flowing in the chemical liquid circulating line; and a controller configured to apply a control signal to the pump unit to control a revolution per minute (RPM) of the pump unit to control a flow rate of the chemical liquid to be supplied to the substrate treating apparatus through the chemical liquid circulating line, wherein the pump unit includes a rotatable impeller disposed therein, wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid.

In one implementation of the chemical liquid supply module, the pump unit is embodied as a magnetic levitation-type pump configured to rotate the impeller in a non-contact manner under a magnetic force.

In one implementation of the chemical liquid supply module, the pump unit includes: a pump housing installed at the chemical liquid circulating line, wherein the chemical liquid flows in the pump housing; the impeller received inside the pump housing and supported and suspended in a non-contact manner at a center of the pump housing under the magnetic force; and a motor driver including a stator installed on the pump housing and a rotor installed in the impeller and spaced apart from the stator, wherein the impeller rotates in a non-contact manner under the magnetic field generated between the stator and the rotor.

In one implementation of the chemical liquid supply module, the controller is configured to: calculate the RPM of the impeller capable of heating the chemical liquid to the predetermined heating temperature, based on the predetermined heating temperature input thereto; and apply a control signal to the motor driver to generate the magnetic field between the stator and the rotor based on the calculated RPM.

In one implementation of the chemical liquid supply module, the chemical liquid supply module further comprises a bypass line branching from the chemical liquid circulating line and extending to the chemical liquid tank, wherein a portion of the chemical liquid flowing through the chemical liquid circulating line flows through the bypass line to the chemical liquid tank such that a flow rate of the chemical liquid circulating through the chemical liquid circulating line is kept constant.

In one implementation of the chemical liquid supply module, the bypass line branches from a position of the chemical liquid circulating line downstream of the pump unit in a flow direction of the chemical liquid circulating through the chemical liquid circulating line.

In one implementation of the chemical liquid supply module, a relief valve is installed at the bypass line at a branching position thereof at which the bypass line branches from the chemical liquid circulating line, wherein when a flow rate of the chemical liquid circulating through the chemical liquid circulating line exceeds a predetermined circulation flow rate, the relief valve is configured to selectively open the bypass line such that at least a portion of the chemical liquid flowing in the chemical liquid circulating line flows through the bypass line to the chemical liquid tank.

In one implementation of the chemical liquid supply module, a flow rate control valve is installed at the bypass line at a branching position thereof at which the bypass line branches from the chemical liquid circulating line, wherein a flow rate control valve is configured to control a flow rate of a portion of the chemical liquid flowing through the bypass line to the chemical liquid tank such that a flow rate of the chemical liquid circulating through the chemical liquid circulating line is kept constant at a predetermined circulation flow rate.

In one implementation of the chemical liquid supply module, the chemical liquid circulating line includes: a temperature sensor installed at the chemical liquid circulating line to measure a temperature of the chemical liquid circulating through the chemical liquid circulating line; a pressure sensor installed at the chemical liquid circulating line to measure a pressure of the chemical liquid circulating through the chemical liquid circulating line; and a flow rate sensor installed at the chemical liquid circulating line to measure a flow rate of the chemical liquid circulating through the chemical liquid circulating line.

In one implementation of the chemical liquid supply module, the chemical liquid circulating line further includes: a filter installed in the chemical liquid circulating line to remove foreign substances contained in the chemical liquid circulating through the chemical liquid circulating line; and a bubble cutter installed in the chemical liquid circulating line to remove air bubbles contained in the chemical liquid circulating through the chemical liquid circulating line.

In one implementation of the chemical liquid supply module, the temperature sensor is installed at a position of the chemical liquid circulating line positioned between the pump unit and a branching position at which the bypass line branches from the chemical liquid circulating line, such that the temperature sensor is positioned downstream of the pump unit in a flow direction of the chemical liquid circulating through the chemical liquid circulating line.

In one implementation of the chemical liquid supply module, the controller is configured to fully open the flow rate control valve until the temperature of the chemical liquid sensed by the temperature sensor reaches the predetermined heating temperature, such that an entire amount of the chemical liquid is collected through the bypass line into the chemical liquid tank until the chemical liquid is heated to the predetermined heating temperature, during an initial operation of the pump unit.

In one implementation of the chemical liquid supply module, the controller is configured to apply a control signal to the pump unit during an operation of the pump unit so as to: increase the RPM of the impeller in response to that the temperature of the chemical liquid sensed by the temperature sensor falls below the predetermined heating temperature; or decrease the RPM of the impeller in response to that the temperature of the chemical liquid exceeds the predetermined heating temperature.

In one implementation of the chemical liquid supply module, the controller is configured to apply a control signal to the flow rate control valve so as to: increase an opening amount of the flow rate control valve in response to that the flow rate of the chemical liquid sensed by the flow rate sensor exceeds the predetermined circulation flow rate due to increase in the RPM of the impeller; or decrease the opening amount of the flow rate control valve or close the flow rate control valve in response to that the flow rate of the chemical liquid sensed by the flow rate sensor falls below the predetermined circulating flow rate due to decrease in the RPM of the impeller.

In one implementation of the chemical liquid supply module, the chemical liquid supply module further comprises an auxiliary heater installed on the chemical liquid circulating line to heat the chemical liquid circulating through the chemical liquid circulating line.

In one implementation of the chemical liquid supply module, the controller is configured to apply a control signal to the auxiliary heater to heat the chemical liquid until the chemical liquid is heated to the predetermined heating temperature during an initial operation of the pump unit.

In one implementation of the chemical liquid supply module, the chemical liquid supply module further comprises a gas discharger connected to the chemical liquid tank and configured to discharge an inert gas into the receiving space so as to reduce a content of dissolved oxygen in the chemical liquid received in the receiving space of the chemical liquid tank.

In one implementation of the chemical liquid supply module, the chemical liquid supply module further comprises a chemical liquid supply line connected to an external chemical liquid supply source and the chemical liquid tank to supply the chemical liquid from the external chemical liquid supply source to the receiving space of the chemical liquid tank.

According to a second aspect of the present disclosure, a substrate treating apparatus includes: a chamber having a treating space defined therein in which a substrate treating process is performed; a substrate support unit installed in the treating space and configured to rotatably support the substrate; a chemical liquid spray unit installed in the treating space so as to be located on top of the substrate support unit, wherein the chemical liquid spray unit is configured to spray at least one type chemical liquid onto the substrate through a spray nozzle; a chemical liquid supply module configured to supply the chemical liquid to the chemical liquid spray unit; and a collection unit installed in the treating space and formed in a cylindrical shape with an open top so as to surround the substrate support unit, wherein the collection unit is configured to collect the chemical liquid scattering from the substrate when the substrate rotates, wherein the chemical liquid supply module includes: a chemical liquid tank having a receiving space defined therein capable of receiving therein chemical liquid; a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank; a pump unit installed at the chemical liquid circulating line and configured to control a flow rate and a pressure of the chemical liquid flowing in the chemical liquid circulating line; and a controller configured to apply a control signal to the pump unit to control a revolution per minute (RPM) of the pump unit to control a flow rate of the chemical liquid to be supplied to the substrate treating apparatus through the chemical liquid circulating line, wherein the pump unit includes a rotatable impeller disposed therein, wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid.

According to a third aspect of the present disclosure, a chemical liquid supply module includes: a chemical liquid tank having a receiving space defined therein capable of receiving therein chemical liquid; a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank; a pump unit installed at the chemical liquid circulating line and configured to control a flow rate and a pressure of the chemical liquid flowing in the chemical liquid circulating line; a bypass line branching from the chemical liquid circulating line and extending to the chemical liquid tank, wherein a portion of the chemical liquid flowing through the chemical liquid circulating line flows through the bypass line to the chemical liquid tank such that a flow rate of the chemical liquid circulating through the chemical liquid circulating line is kept constant, wherein the bypass line branches from a position of the chemical liquid circulating line downstream of the pump unit in a flow direction of the chemical liquid circulating through the chemical liquid circulating line; and a controller configured to apply a control signal to the pump unit to control a revolution per minute (RPM) of the pump unit to control a flow rate of the chemical liquid to be supplied to the substrate treating apparatus through the chemical liquid circulating line, wherein the pump unit is embodied as a magnetic levitation-type pump configured to rotate the impeller in a non-contact manner under a magnetic force, wherein the pump unit includes: a pump housing installed at the chemical liquid circulating line, wherein the chemical liquid flows in the pump housing; the impeller received inside the pump housing and supported and suspended in a non-contact manner at a center of the pump housing under the magnetic force; and a motor driver including a stator installed on the pump housing and a rotor installed in the impeller and spaced apart from the stator, wherein the impeller rotates in a non-contact manner under the magnetic field generated between the stator and the rotor, wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid,

6 wherein the controller is configured to: calculate the RPM of the impeller capable of heating the chemical liquid to the predetermined heating temperature, based on the predetermined heating temperature input thereto; and apply a control signal to the motor driver to generate the magnetic field between the stator and the rotor based on the calculated RPM.

Therefore, according to each of the chemical liquid supply modules according to various embodiments of the present disclosure, and the substrate treating apparatus including the same, the magnetic levitation-type pump may be used as the pump unit to circulate the chemical liquid in the chemical liquid circulating line. Thus, during the circulation of the chemical liquid, the chemical liquid may be heated using the friction heat generated from the friction between the impeller rotating inside the pump unit and the chemical liquid. For example, as the RPM of the pump unit increases, the friction heat also increases, so that the pump unit may also perform the role of a heater. In this regard, active temperature control may be achieved by varying the RPM of the pump unit.

Furthermore, during the operation of the pump unit at a high RPM to heat the chemical liquid to a high temperature, the portion of the chemical liquid 1 may flow to the chemical liquid tank through the bypass line. Thus, even though the flow rate of the chemical liquid increases due to the high RPM operation of the pump unit, the flow rate of the chemical liquid in the chemical liquid circulating line may be kept constant regardless of the RPM of the pump unit.

In this way, the chemical liquid supply modules and the substrate treatment apparatus including the same may be implemented in which the magnetic levitation-type pump may be used as the pump unit to implement the friction heat-based chemical liquid temperature maintenance scheme using the variable control of the RPM of the impeller rotating in the pump unit, and thus, there is no need to operate a separate heater to raise the temperature of the chemical liquid, and thus a configuration of the apparatus may be simplified, and a lower temperature of a liquid contact area thereof compared to that of the conventional coil-based heater may be maintained due to the heat generation based on the friction, thereby improving heating stability (particle and heater related issues, etc.).

Effects of the present disclosure are not limited to the effects mentioned above, and other effects not mentioned will be clearly understood by those skilled in the art from the descriptions below.

BRIEF DESCRIPTION OF THE DRAWINGS

The above and other purposes, features and other advantages of the present disclosure will be more clearly understood from the following detailed description taken in conjunction with the accompanying drawings, in which:

FIG. 2 is a schematic diagram schematically showing a chemical liquid supply module according to an embodiment of the present disclosure;

FIGS. 4 to 6 are schematic diagrams schematically showing chemical liquid supply modules according to further embodiments of the present disclosure.

DETAILED DESCRIPTION OF THE DISCLOSURE

Figure 1:
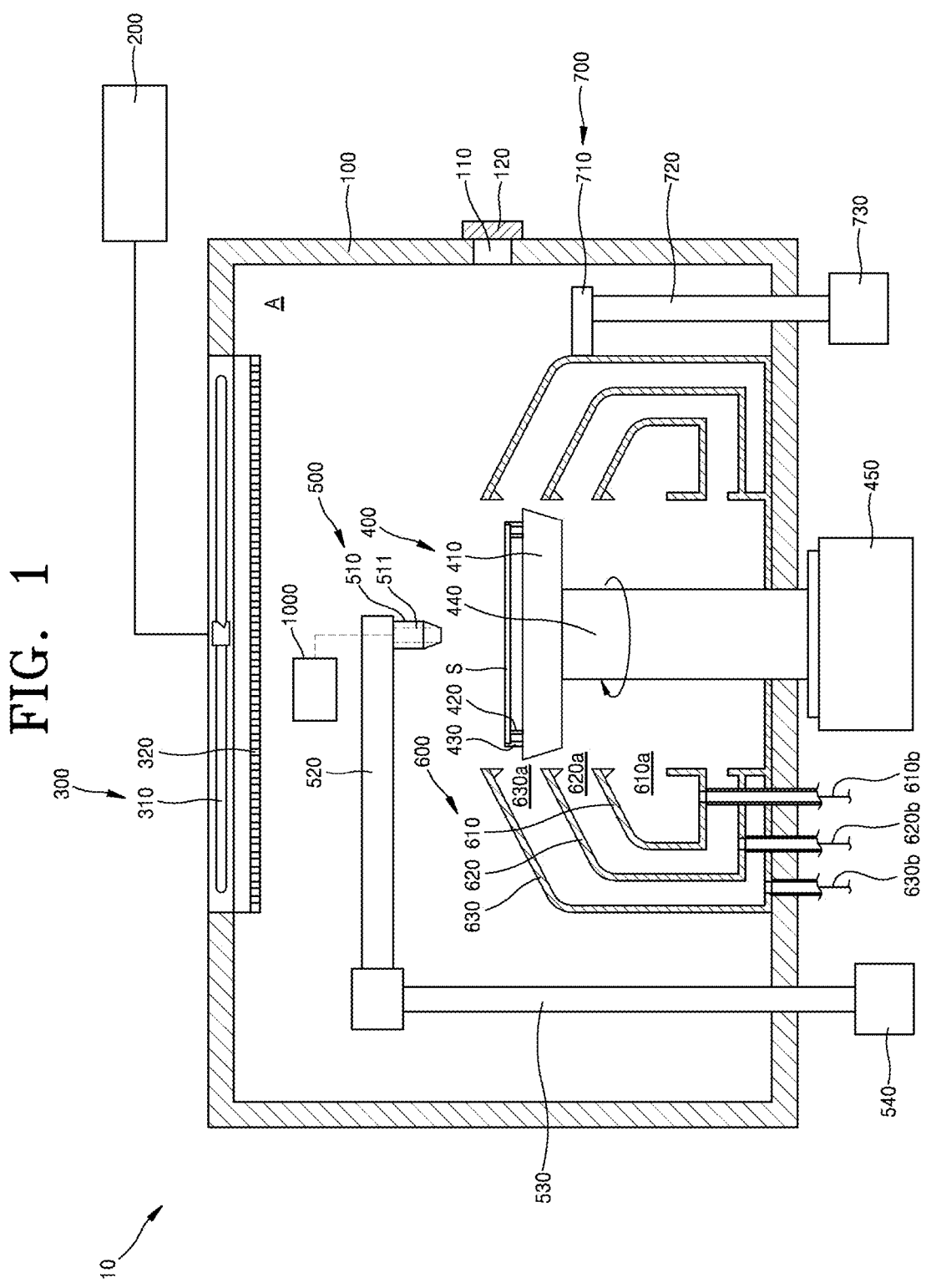
FIG. 1 is a cross-sectional view schematically showing a substrate treating apparatus with a chemical liquid supply module installed according to an embodiment of the present disclosure.

Hereinafter, various preferred embodiments of the present disclosure will be described in detail with reference to the attached drawings.

The embodiments of the present disclosure are provided to more completely describe the present disclosure for those skilled in the art. The following embodiments may be modified in various forms, and the scope of the present disclosure is not limited to the following embodiments. Rather, these embodiments are provided so that the present disclosure is thorough and complete, and are provided to fully convey the spirit of the present disclosure to those skilled in the art. Furthermore, a thickness or a size of each layer in the drawing is exaggerated for convenience and clarity of illustration. A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof.

Hereinafter, embodiments of the present disclosure will be described with reference to drawings schematically showing ideal embodiments of the present disclosure. In the drawings, variations of a depicted shape may be expected, depending, for example, on manufacturing techniques and/or tolerances. Therefore, the embodiments of the present disclosure should not be construed as being limited to the specific shape of the area shown herein, and should include, for example, change in a shape caused in a manufacturing process.

Figure 2:
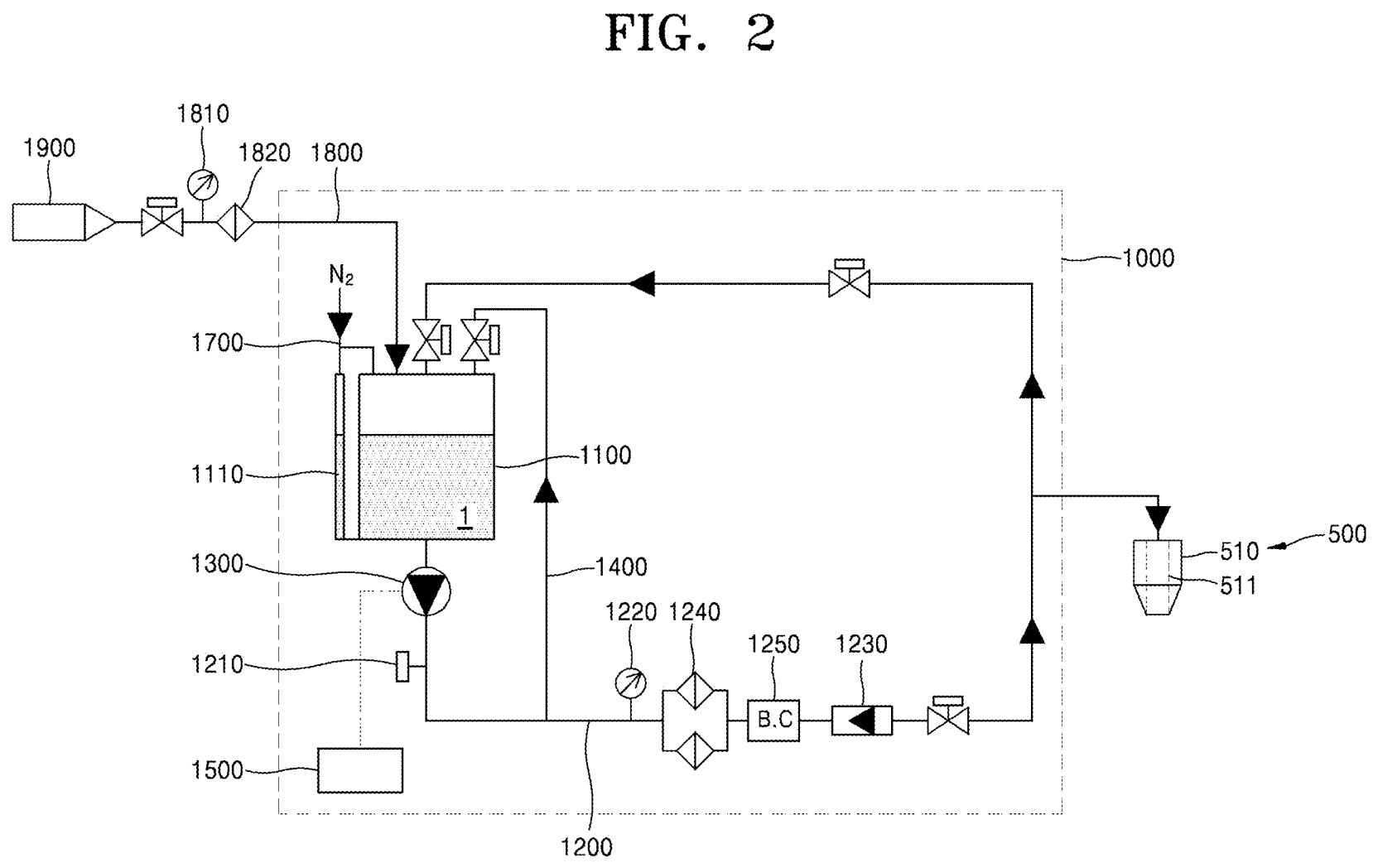
Figure 3:
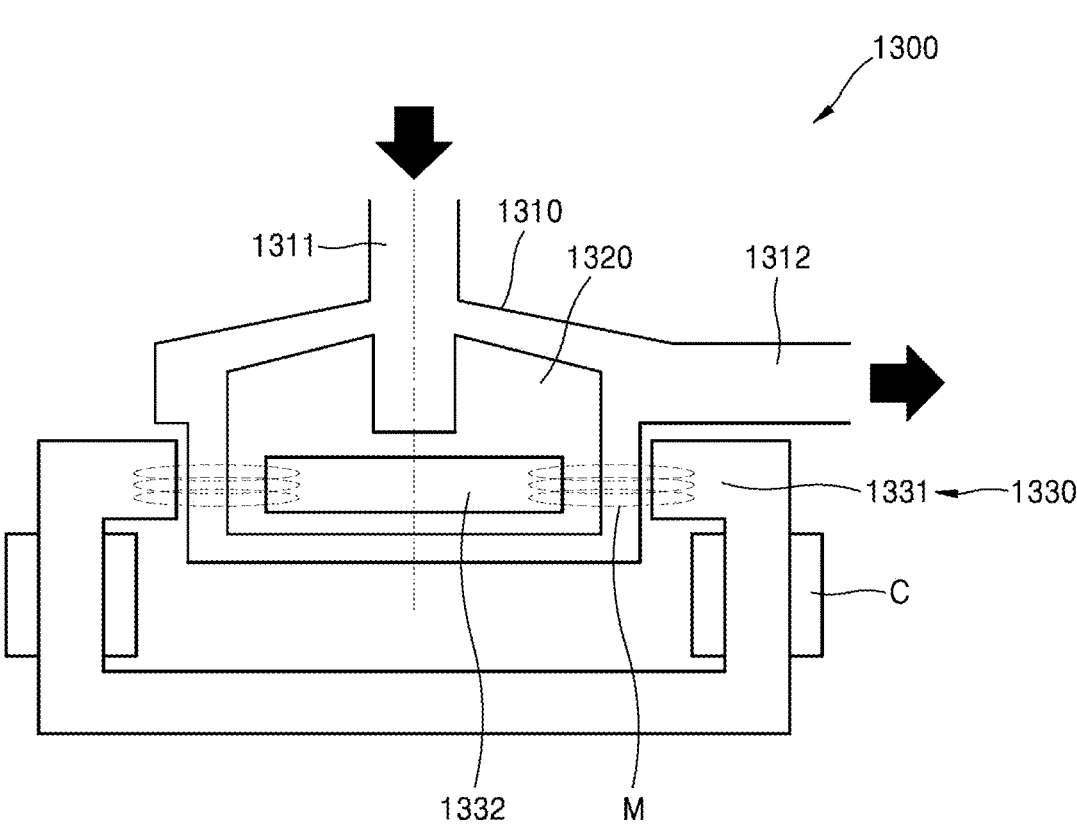
FIG. 3 is a schematic diagram schematically showing a pump unit of the chemical liquid supply module in FIG. 2.
Figure 4:
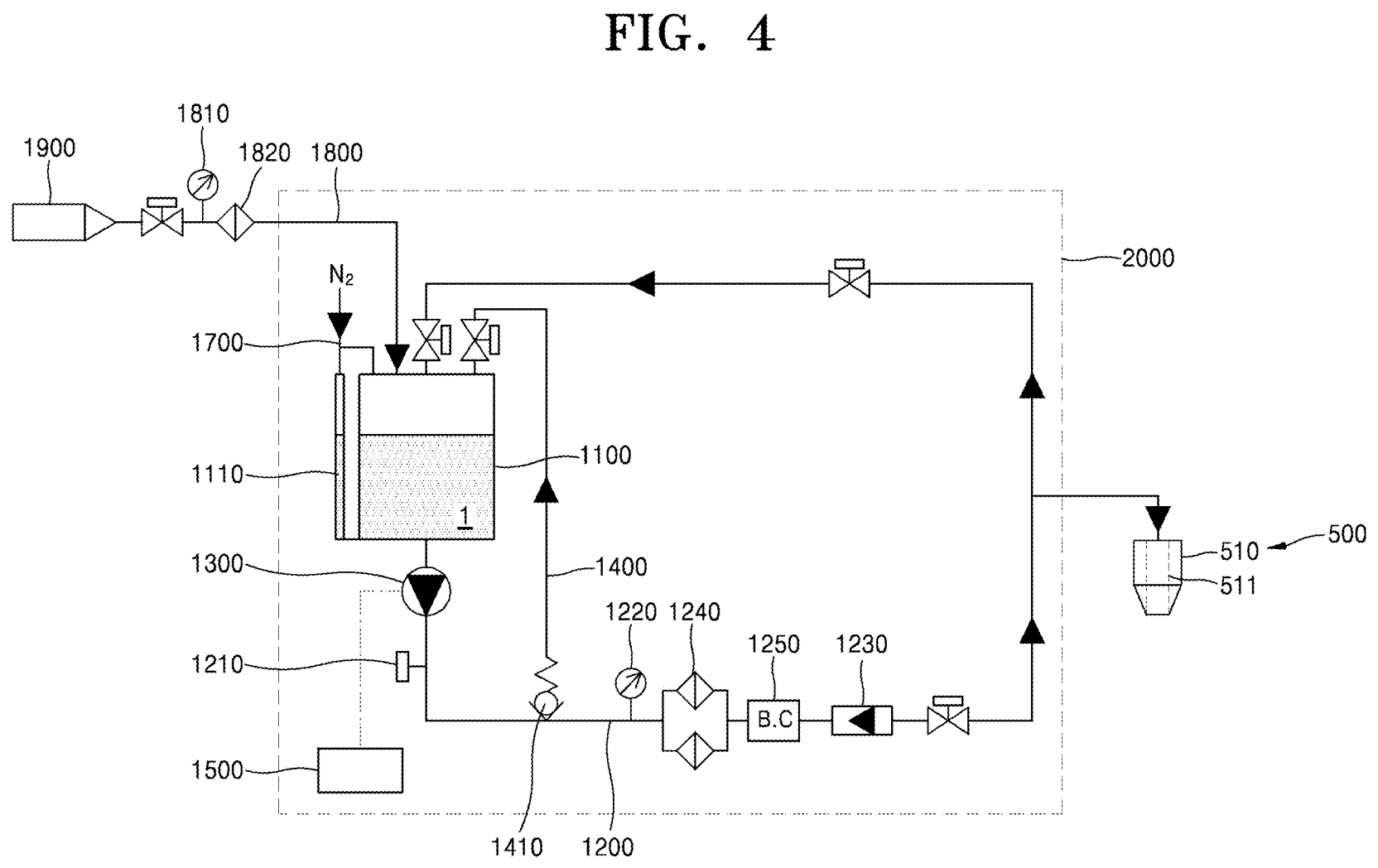
Figure 5:
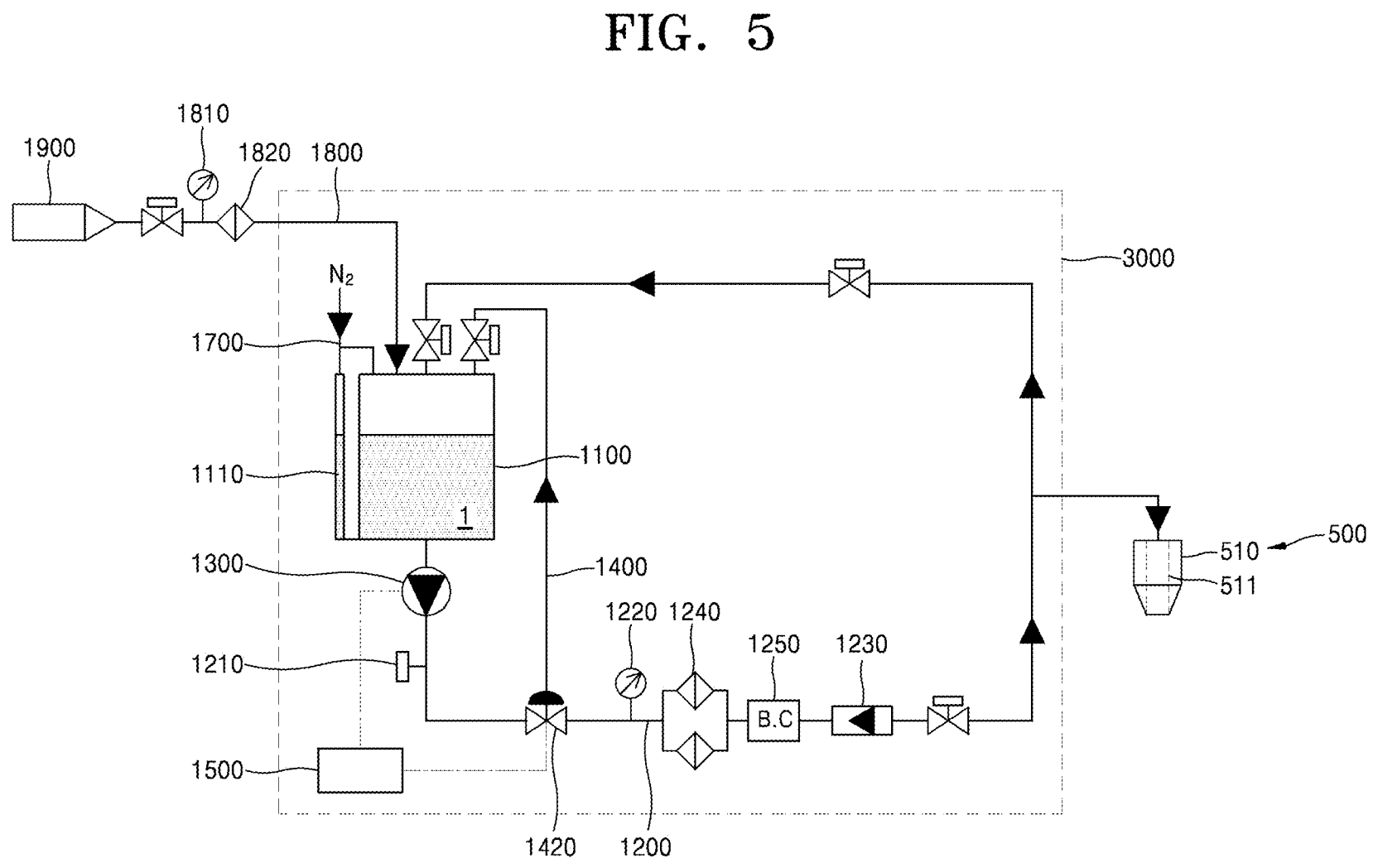
Figure 6:
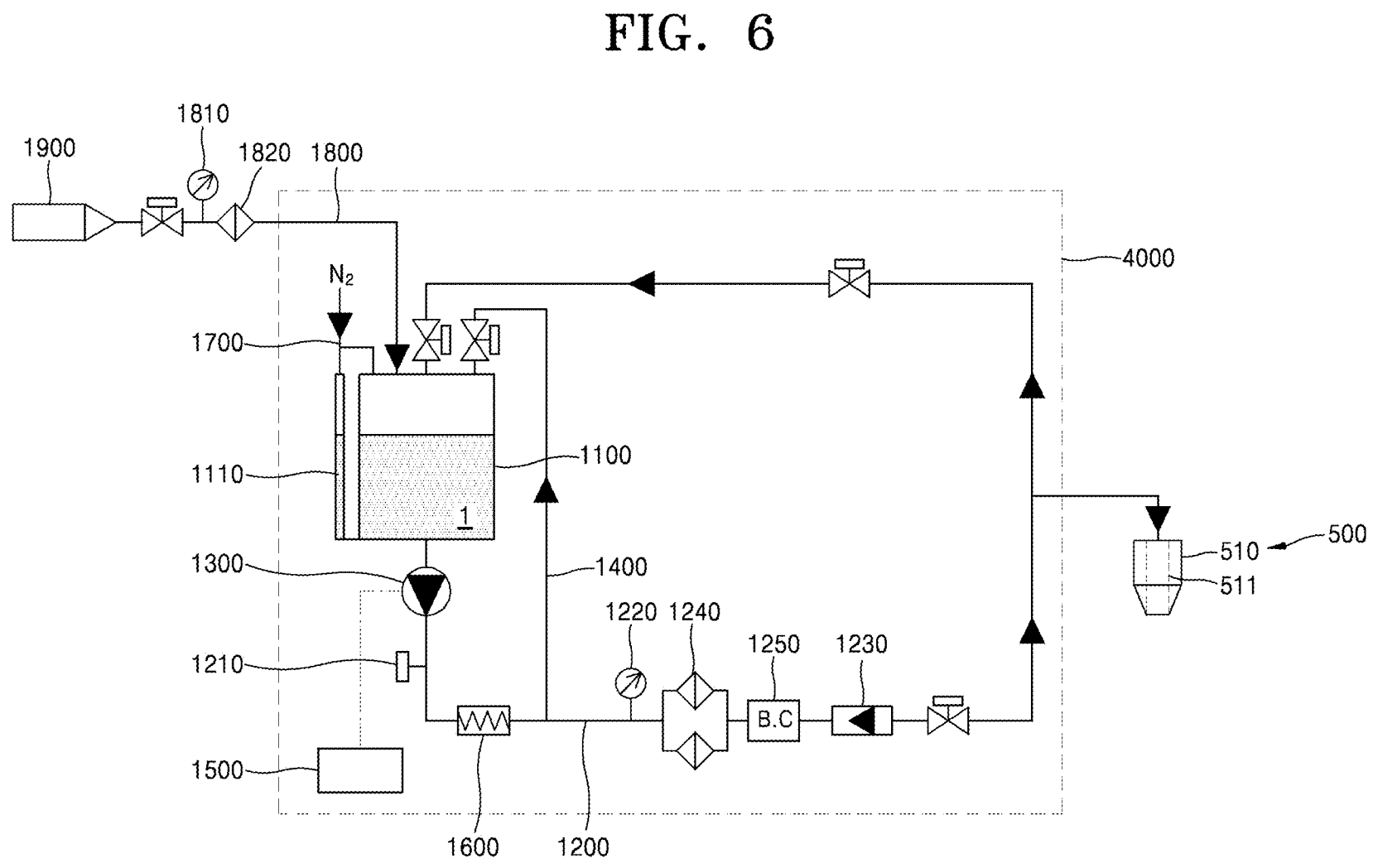

FIG. 1 is a cross-sectional view schematically showing a substrate treating apparatus 10 having a chemical liquid supply module 1000 according to an embodiment of the present disclosure. FIG. 2 is a schematic diagram schematically showing the chemical liquid supply module 1000 according to an embodiment of the present disclosure. FIG. 3 is a schematic diagram schematically showing a pump unit 1300 of the chemical liquid supply module 1000 in FIG. 2. FIGS. 4 to 6 are schematic diagrams schematically showing chemical liquid supply modules 2000, 3000, and 4000 according to further embodiments of the present disclosure.

First, as shown in FIG. 1, the substrate treating apparatus 10 in which the chemical liquid supply module 1000 according to an embodiment of the present disclosure is installed may be largely composed of a chamber 100, a gas supply unit 200, a fan filter unit 300, a substrate support unit 400, a chemical liquid spray unit 500, a collection unit 600, and a vertically-moving unit 700.

As shown in FIG. 1, a treatment space A may be defined inside the chamber 100 so that a cleaning process on a substrate S may be performed therein. For example, the chamber 100 may be formed in a square cylindrical shape, a polygonal cylindrical shape, or a circular cylindrical shape, and may provide the treating space A within which a cleaning process on the substrate S is performed.

Furthermore, the chamber 100 may have a gate 110 defined at one side thereof facing a transfer chamber (not shown), and the gate 110 may be opened and closed by a door 120. The gate 110 may function as an entrance through which the substrate S may be brought into the treating space A.

As shown in FIG. 1, the substrate support unit 400 is of a type of spin head and is installed in the treating space A inside the chamber 100 and may rotatably support the substrate S during the cleaning process.

More specifically, the substrate support unit 400 may be composed of a spin body 410, a support pin 420, a chuck pin 430, and a support shaft 440. The spin body 410 may have an upper surface formed in a generally circular shape in a top view. The support shaft 440 capable of being rotated by a driver 450 may be fixedly coupled to a lower surface of the spin body 410.

A plurality of support pins 420 of the substrate support unit 400 may be formed on the upper surface of the spin body 410. For example, the plurality of support pins 420 may be arranged to be spaced apart from each other by a predetermined spacing along an edge portion of the upper surface of the spin body 410. Thus, the plurality of support pins 420 may be arranged along a circumferential direction around the center shaft (axis of rotation) of the spin body 410 so as to be spaced from each other by an equal spacing. Thus, a series of the support pins 420 may be arranged in an annular ring shape and may support the substrate S at an edge portion of a back surface of the substrate S such that the substrate S is spaced, by a predetermined distance, from the upper surface of the spin body 410.

Furthermore, a plurality of chuck pins 430 of the substrate support unit 400 may be formed on the upper surface of the spin body 410, and may be positioned farther away from a central axis of the spin body 410 than the support pins 420 may be. This chuck pin 430 may be formed so as to protrude upwardly from the upper surface of the spin body 410 beyond the support pin 420. Thus, the chuck pins 430 may support a side of the substrate S such that the substrate S may be prevented from deviating laterally from its original position by a centrifugal force when the spin body 410 rotates.

Furthermore, the chuck pin 430 may be installed so as to perform linear movement to between a waiting position and a support position spaced, by a predetermined distance, from each other along a radial direction of the spin body 410. For example, the waiting position may be a position farther away from the central axis of the spin body 410 than the support position may be. Accordingly, when the substrate S is loaded or unloaded into or from the spin body 410, the chuck pin 430 may be located at the waiting position. When a cleaning process is performed on the substrate S, the chuck pin 430 may move linearly to the support location. At the support position, the chuck pin 430 may be in contact with the side of the substrate S.

As shown in FIG. 1, the collection unit 600 may be formed in a cylindrical shape with an open top so as to surround the substrate support unit 400 and may be installed in the treating space A. The collection unit 600 may collect the chemical liquid scattering from the substrate S when the substrate S rotates.

For example, the collection unit 600 may have an overall barrel shape with an open top, and may be composed of an inner collection container 610, a middle collection container 620, and an outer collection container 630. The collection containers 610, 620, and 630 may collect different chemical liquids used in the cleaning process, respectively.

More specifically, the inner collection container 610 may be formed in an annular ring shape surrounding the substrate support unit 400. The middle collection container 620 may be formed in an annular ring shape surrounding the inner collection container 610, and the outer collection container 630 may be formed in an annular ring shape surrounding the middle collection container 620. A first space 610*a* of the inner collection container 610, a second space 620*a* of the middle collection container 620, and a third space 630*a* of the outer collection container 630 may function as inlets through which the different chemical liquids flow into the inner collection container 610, the middle collection container 620 and the outer collection container 630, respectively.

For example, the inlets of the collection containers 610, 620 and 630 may be located at different vertical levels, and collection lines 610*b*, 620*b*, and 630*b* may be connected to bottoms of the collection containers 610, 620, and 630, respectively. The collection lines 610*b*, 620*b*, and 630*b* may respectively discharge the different chemical liquids introduced into the collection containers 610, 620, and 630 out thereof. Then, the discharged chemical liquids may be stored in an external chemical liquid recycling system (not shown) for being recycled and reused later.

As shown in FIG. 1, the vertically-moving unit 700 may move the collection unit 600 in the vertical direction. As the collection unit 600 ascends or descends vertically under the operation of the vertically-moving unit 700, a relative vertical level of the collection unit 600 with respect to that of the substrate support unit 400 may change.

The vertically-moving unit 700 may be composed of a bracket 710, a movable shaft 720, and a driver 730. For example, the bracket 710 may be fixedly installed on the outer wall of the collection unit 600. The movable shaft 720 that moves in an up or down direction by the driver 730 may be fixedly coupled to the bracket 710.

More specifically, when the substrate S is loaded into the substrate support unit 400 or unloaded from the substrate support unit 400, the collection unit 600 may be lowered by the vertically-moving unit 700 such that the substrate support unit 400 may be positioned on top of the collection unit 600. Furthermore, a vertical level of the collection unit 600 may be adjusted so that the different chemical liquids may flow into the collection containers 610, 620, and 630 preset depending on the type of the chemical liquids supplied to the substrate S during the cleaning process.

As shown in FIG. 1, the gas supply unit 200 may supply air to the treating space A of the chamber 100. For example, the gas supply unit 200 may supply air whose a temperature and a humidity are controlled to the treating space A of the chamber 100. For this purpose, although not shown, the gas supply unit 200 may include a gas inlet having a filter installed thereat in order to receive gas from which impurities have been removed from an outside, a buffer unit to temporarily store the received gas therein, a humidity control unit that controls the humidity of the gas, and a temperature control unit that controls the temperature of the gas.

As shown in FIG. 1, the fan filter unit 300 is installed at a top of the chamber 100 so as to blow the air supplied from the gas supply unit 200 into the treating space A. More specifically, the fan filter unit 300 may include a blowing fan 310 that generates a blowing force to blow the air to the treating space A, and a perforated plate 320 formed in a flat plate shape with an area size corresponding to a rotation radius of the blowing fan 310, wherein the perforated plate 320 has a plurality of perforations formed therein. In this regard, the perforated plate 320 may have the plurality of perforations uniformly spaced from each other by an equal spacing, so that the air supplied from the gas supply unit 200 may be uniformly spread and blown into the treating space A of the chamber 100.

Furthermore, as shown in FIG. 1, the chemical liquid spray unit 500 may be installed in the treating space A so as to be located on top of the substrate support unit 400, and may be configured to spray at least one type chemical liquid onto the substrate S. For example, the chemical liquid spray unit 500 may include a plurality of units which may receive a plurality of chemical liquids from the chemical liquid supply module 1000, which will be described later, and may spray the plurality of chemical liquids onto the substrate S, respectively. This chemical liquid spray unit 500 may be largely composed of a spray nozzle 510, a support table 520, and a support shaft 530.

For example, the support shaft 530 may be disposed on one side of the collection unit 600, and may rotate and vertically move under an operation of a driving member 540. Furthermore, one end of the support table 520 may be coupled to the support shaft 530, while the support table 520 may support the spray nozzle 510 installed at the other end of the support table 520.

Furthermore, under the rotation of the support shaft 530, the spray nozzle 510 may swing while being positioned on top of the substrate support unit 400. In this regard, the chemical liquid supplied from the chemical liquid supply module 1000 to be described later and then sprayed from the spray nozzle 510 may be a chemical, a rinse liquid, a liquid organic solvent, etc., and supply control of the chemical liquid (control of a flow rate and a temperature thereof) may be achieved by the chemical liquid supply module 1000.

More specifically, in the substrate treating apparatus 10 as shown in FIG. 1 and FIG. 2, the spray nozzle 510 of the chemical liquid spray unit 500 that is installed on top of the substrate support unit 400 which supports and rotates the substrate S, and sprays the chemical liquid onto the substrate S may have a spray flow passage 511 defined therein through which the chemical liquid flows toward a discharge hole formed at a lower end of the nozzle.

Hereinafter, the chemical liquid supply apparatus 1000 for supplying the chemical liquid to the chemical liquid spray unit 500 of the substrate treating apparatus 10, and a chemical liquid tank module 1100 included in the chemical liquid supply apparatus 1000 will be described in detail.

As shown in FIG. 1 and FIG. 2, the chemical liquid supply module 1000 may be configured to receive each of the different chemical liquids supplied from an external chemical liquid supply source 1900 through a chemical liquid supply line 1800 and to store each of the received different chemical liquids into a receiving space of the chemical liquid tank 1100, and to mix the chemical liquids with each other, and to supply the chemical liquid whose a flow rate, a temperature, and a concentration are adjusted to suit the process condition to the chemical liquid spray unit 500.

As shown in FIG. 2, the chemical liquid supply module 1000 may be largely composed of the chemical liquid tank 1100, a chemical liquid circulating line 1200, a pump unit 1300, and a bypass line 1400, and controller 1500.

As shown in FIG. 2, the chemical liquid tank 1100 may have the receiving space defined therein that may receive the chemical liquid 1 therein. For example, the chemical liquid tank 1100 may be formed in a square cylinder shape, a circular cylinder shape, or a polygonal cylinder shape, and may have a predetermined receiving space capable of containing the chemical liquid 1 therein.

The chemical liquid tank 1100 may receive the chemical liquid 1 to be supplied to the receiving space from the external chemical liquid supply source 1900 through the chemical liquid supply line 1800 connected to one side of the chemical liquid tank 1100. In this regard, a pressure sensor 1810 that measures a pressure of the chemical liquid 1 to be supplied to the chemical liquid tank 1100 and a filter 1820 that removes foreign substances contained in the chemical liquid 1 may be installed at the chemical liquid supply line 1800.

Furthermore, a vertical level gauge 1110 may be installed on one side of the chemical liquid tank 1100 to check a vertical level of a top surface of the chemical liquid 1 contained in the receiving space. The vertical level gauge 1110 may be formed in a tube shape extending in an elongate manner in a height direction of the chemical liquid tank 1100 and may be installed to communicate with the receiving space of the chemical liquid tank 1100.

Furthermore, a gas discharger 1700 that discharges an inert gas into the receiving space so as to reduce a content of dissolved oxygen in the chemical liquid 1 received in the receiving space may be connected to the other side of the chemical liquid tank 1100. In this regard, nitrogen ($N_2$) may be used as the inert gas. In addition to nitrogen, any type of inert gas that does not react with other elements so as not to affect the chemical liquid 1 may be used.

As shown in FIG. 2, the chemical liquid circulating line 1200 may supply the chemical liquid 1 contained in the chemical liquid tank 1100 to the chemical liquid spray unit 500 of the substrate treating apparatus 10, and may recirculate a remaining portion of the chemical liquid that is not supplied to the chemical liquid spray unit 500 of the substrate treating apparatus 10 into the chemical liquid tank 1100.

In order to supply the chemical liquid 1 adjusted to suit the process condition to the chemical liquid spray unit 500 of the substrate treating apparatus 10, the chemical liquid circulating line 1200 may be configured to include a temperature sensor 1210 installed at the chemical liquid circulating line 1200 to measure a temperature of the chemical liquid 1 circulating through the chemical liquid circulating line 1200, a pressure sensor 1220 installed at the chemical liquid circulating line 1200 to measure the pressure of the chemical liquid 1 circulating through the chemical liquid circulating line 1200, a flow rate sensor 1230 installed at the chemical liquid circulating line 1200 to measure a flow rate of the chemical liquid 1 circulating through the chemical liquid circulating line 1200, a filter 1240 installed at the chemical liquid circulating line 1200 to remove foreign substances contained in the chemical liquid 1 circulating through the chemical liquid circulating line 1200, and a bubble cutter 1250 installed at the chemical liquid circulating line 1200 to remove air bubbles contained in the chemical liquid 1 circulating through the chemical liquid circulating line 1200.

In this regard, the temperature sensor 1210 may be installed at the chemical liquid circulating line 1200 and between the pump unit 1300 and a position at which the bypass line 1400 branches from the chemical liquid circulating line 1200 and may be located downstream of the pump unit 1300 in a flow direction of the chemical liquid 1 circulating through the chemical liquid circulating line 1200 such that the temperature sensor 1210 may operate in association with the bypass line 1400 which will be described later.

Furthermore, the bypass line 1400 may branch from the chemical liquid circulating line 1200 so as to be connected to the chemical liquid tank 1100 such that a portion of the chemical liquid 1 flowing in the chemical liquid circulating line 1200 may flow through the bypass line 1400 to the chemical liquid tank 1100. Thus, even when the pressure and the flow rate of the chemical liquid 1 inside the chemical liquid circulating line 1200 increase due to a high RPM (Revolution Per Minute) operation of the pump unit 1300 as described later for heating the chemical liquid 1, the pressure and the flow rate of the chemical liquid 1 circulating through the chemical liquid circulating line 1200 may be kept constant.

In this regard, the bypass line 1400 may branch from the chemical liquid circulating line 1200 at a position thereof downstream of the pump unit 1300 in the flow direction of the chemical liquid that circulates through the chemical liquid circulating line 1200 to efficiently distribute the increase in the pressure and the flow rate of the chemical liquid 1 resulting from the pump unit 1300.

As shown in FIG. 2, the pump unit 1300 may be installed at the chemical liquid circulating line 1200 so as to control the flow rate and the pressure of the chemical liquid 1 flowing in the chemical liquid circulating line 1200. The controller 1500 may apply a control signal to the pump unit 1300 to control the RPM (Revolution Per Minute) of the pump unit 1300 to control the flow rate of the chemical liquid 1 to be supplied to the chemical liquid spray unit 500 of the substrate treating apparatus 10 through the chemical liquid circulating line 1200.

In this regard, the pump unit 1300 may be embodied as a magnetic levitation-type pump that rotates an impeller 1320 disposed therein under a magnetic force in a non-contact manner. Using a friction heat generated from friction between the rotating impeller 1320 disposed therein and the chemical liquid 1, the chemical liquid 1 to be supplied to the chemical liquid spray unit 500 of the substrate treating apparatus 10 through the chemical liquid circulating line 1200 may be heated to a predetermined heating temperature. In this regard, the RPM of the impeller 1320 of the pump unit 1300 may be controlled to vary based on the predetermined heating temperature under an operation of the controller 1500.

More specifically, as shown in FIG. 2 and FIG. 3, the pump unit 1300 may include a pump housing 1310 installed at the chemical liquid circulating line 1200, and having an inlet 1311 defined at one side thereof through which the chemical liquid 1 is introduced into the pump housing 1310, and an outlet defined at the other side thereof through which the chemical liquid 1 is discharged out of the housing 1310, wherein the chemical liquid 1 flows inside the pump housing 1310; and the impeller 1320 that is received in the pump housing 1310 and is supported and suspended at a center of the pump housing 1310 in a non-contact manner under a magnetic force. The pump unit 1300 may further include a motor driver 1330 including a stator 1331 installed on the pump housing 1310 and having a coil C wound around at least a portion thereof so as to function as an electromagnet, and a rotor 1332 as a permanent magnet installed in the impeller 1320 and spaced apart from the stator 1331. The impeller 1320 may be rotated in a non-contact manner under the magnetic field M generated between the stator 1331 and the rotor 1332.

In this regard, the controller 1500 may calculate the RPM of the impeller 1320 that can heat the chemical liquid 1 to the predetermined heating temperature based on the predetermined heating temperature input from an external sensor according to the process condition, and may apply a control signal to the motor driver 1330 to generate the magnetic field M between the stator 1331 and the rotor 1332 and adjust an intensity thereof based on the calculated RPM.

In this way, the magnetic levitation-type pump may be used as the pump unit 1300 to circulate the chemical liquid 1 within the chemical liquid circulating line 1200. Thus, during the circulation of the chemical liquid 1, the chemical liquid 1 may be heated to the predetermined heating temperature using the friction heat generated from the friction between the impeller 1320 rotating inside the pump unit 1300 and the chemical liquid 1. Furthermore, a portion of the chemical liquid is not circulated to the chemical liquid circulating line 1200, but is immediately by-passed to the chemical liquid tank 1100 via the bypass line 1400. Thus, even when the pump unit 1300 operates at a high RPM to heat the chemical liquid 1 to a high temperature such that the flow rate of the chemical liquids increases, the flow rate of the chemical liquid 1 in the chemical liquid circulating line 1200 may be maintained constant regardless of the RPM of the pump unit 1300.

A configuration of the chemical liquid supply module 1000 is not necessarily limited to what is shown in FIG. 2. A wide variety of configurations in which the pump unit 1300 embodied as the magnetic levitation-type pump may be used to heat the chemical liquid 1 to the predetermined heating temperature via the friction heat generated from the friction between the impeller 1320 rotating inside the pump unit 1300 and the chemical liquid 1 during the circulation of the chemical liquid 1 may be applied.

For example, as in a chemical liquid supply module 2000 according to another embodiment of the present disclosure as shown in FIG. 4, a relief valve 1410 may be installed at a position of the chemical liquid circulating line 1200 at which the bypass line 1400 branches from the chemical liquid circulating line 1200.

Accordingly, when the flow rate of the chemical liquid 1 circulating through the chemical liquid circulating line 1200 is smaller than a predetermined circulation flow rate, the relief valve 1410 may close the bypass line 1400 such that the bypass line 1400 may not operate.

On the contrary, when the RPM of the pump unit 1300 increases to heat the chemical liquid 1, so that the flow rate of the chemical liquid 1 circulating through the chemical liquid circulating line 1200 exceeds the predetermined circulation flow rate, the relief valve 1410 may selectively open the bypass line 1400 under the pressure of the chemical liquid 1, thereby selectively bypassing at least a portion of the chemical liquid 1 flowing in the chemical liquid circulating line 1200 into the chemical liquid tank 1100.

Furthermore, as a chemical liquid supply module 3000 according to still another embodiment of the present disclosure as shown in FIG. 5, a flow rate control valve 1420 may be installed at a position of the chemical liquid circulating line 1200 at which the bypass line 1400 branches from the chemical liquid circulating line 1200.

Accordingly, an opening amount of the flow rate control valve 1420 may be adjusted so that the flow rate of the chemical liquid 1 circulating through the chemical liquid circulating line 1200 may be kept constant at a predetermined circulation flow rate. Thus, the flow rate of the chemical liquid 1 bypassing the chemical liquid tank 1100 through the bypass line 1400 may be adjusted. This adjustment of the opening amount of the flow rate control valve 1420 may be achieved based on a control signal from the controller 1500.

For example, the controller 1500 may fully open the flow rate control valve 1420 until the temperature of the chemical liquid 1 sensed by the temperature sensor 1210 reaches the predetermined heating temperature, such that during an initial operation of the pump unit 1300, an entire amount of the chemical liquid 1 into the chemical liquid tank 1100 may be collected through the bypass line 1400 until the chemical liquid 1 is heated to the predetermined heating temperature.

Accordingly, during the initial operation of the pump unit 1300, the chemical liquid 1 is not circulated through the chemical liquid circulating line 1200, but the entire amount of the chemical liquid 1 is quickly circulated through the bypass line 1400, thereby allowing the chemical liquid 1 to be initially heated more rapidly.

Furthermore, when the temperature of the chemical liquid 1 sensed by the temperature sensor 1210 falls below the predetermined heating temperature during the operation of the pump unit 1300 after the temperature of the chemical liquid 1 has reached the predetermined heating temperature, the controller 1500 may increase the RPM of the impeller 1320 of the pump unit 1300 to increase the friction heat generation. When the temperature of the chemical liquid 1 sensed by the temperature sensor 1210 exceeds the predetermined heating temperature during the operation of the pump unit 1300 after the temperature of the chemical liquid 1 has reached the predetermined heating temperature, the controller 1500 may reduce the RPM of the impeller 1320 of the pump unit 1300 to reduce the friction heat generation. That is, the controller 1500 may apply a control signal varying based on the temperature of the chemical liquid 1 monitored in real time via the temperature sensor 1210 to the pump unit 1300.

In this regard, the controller 1500 may apply the control signal to the flow rate control valve 1420 such that the flow rate of the chemical liquid 1500 that circulates the chemical liquid circulating line 1200 may be kept constant even when the RPM of the impeller 1320 of the pump unit 1300 changes in order to maintain a constant temperature of the chemical liquid 1. Thus, when the flow rate of the chemical liquid 1 sensed by the flow rate sensor 1230 exceeds the predetermined circular flow rate due to the increase in the RPM of the impeller 1320, the controller 1500 may increase the opening amount of the flow rate control valve 1420. To the contrary, when the flow rate of the chemical liquid 1 sensed by the flow rate sensor 1230 is smaller than the predetermined circular flow rate due to decrease in the RPM of the impeller 1320, the controller 1500 may reduce the opening amount of the flow rate control valve 1420 or close the flow rate control valve 1420.

Furthermore, as a chemical liquid supply module 4000 according to still yet another embodiment of the present disclosure as shown in FIG. 6, an auxiliary heater 1600 may be installed at the chemical liquid circulating line 1200 to initially heat the chemical liquid 1 circulating through the chemical liquid circulating line 1200 in an auxiliary manner. The auxiliary heater 1600 may be controlled by a control signal from the controller 1500.

For example, during the initial operation of the pump unit 1300, the controller 1500 may apply a control signal to the auxiliary heater 1600 to heat the chemical liquid 1 under an operation of a combination of the auxiliary heater 1600 and the pump unit 1300 until the chemical liquid 1 is heated to the predetermined heating temperature.

Accordingly, during the initial operation of the pump unit 1300, the chemical liquid 1 may be heated using the auxiliary heater 1600 in addition to the friction heat generated from the pump unit 1300, thereby allowing the initial heating of the chemical liquid 1 to be achieved more quickly. The operation scheme of the auxiliary heater 1600 may be a conventional coil-based heat conduction scheme. However, since the auxiliary heater 1600 serves to perform auxiliary heating of the chemical liquid 1, the auxiliary heater 1600 may have a smaller size compared to a conventional heater.

Therefore, according to each of the chemical liquid supply modules 1000, 2000, 3000, and 4000 according to various embodiments of the present disclosure, and the substrate treating apparatus 10 including the same, the magnetic levitation-type pump may be used as the pump unit 1300 to circulate the chemical liquid 1 in the chemical liquid circulating line 1200. Thus, during the circulation of the chemical liquid 1, the chemical liquid 1 may be heated using the friction heat generated from the friction between the impeller 1320 rotating inside the pump unit 1300 and the chemical liquid 1. For example, as the RPM of the pump unit 1300 increases, the friction heat also increases, so that the pump unit 1300 may also perform the role of a heater. In this regard, active temperature control may be achieved by varying the RPM of the pump unit 1300.

Furthermore, during the operation of the pump unit 1300 at a high RPM to heat the chemical liquid 1 to a high temperature, the portion of the chemical liquid 1 may flow to the chemical liquid tank 1100 through the bypass line 1400. Thus, even though the flow rate of the chemical liquid 1 increases due to the high RPM operation of the pump unit 1300, the flow rate of the chemical liquid 1 in the chemical liquid circulating line 1200 may be kept constant regardless of the RPM of the pump unit 1300.

Therefore, the chemical liquid supply modules 1000, 2000, 3000, and 4000 and the substrate treatment apparatus 10 including the same may be implemented in which the magnetic levitation-type pump may be used as the pump unit 1300 to implement the friction heat-based chemical liquid temperature maintenance scheme using the variable control of the RPM of the impeller 1320 rotating in the pump unit, and thus, there is no need to operate a separate heater to raise the temperature of the chemical liquid 1, and thus a configuration of the apparatus may be simplified, and a lower temperature of a liquid contact area thereof compared to that of the conventional coil-based heater may be maintained due to the heat generation based on the friction, thereby improving heating stability (particle and heater related issues, etc.).

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A chemical liquid supply module comprising:
a chemical liquid tank having a receiving space defined therein capable of receiving therein chemical liquid;
a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank;
a pump unit installed at the chemical liquid circulating line and configured to control a flow rate and a pressure of the chemical liquid flowing in the chemical liquid circulating line; and
a controller configured to apply a control signal to the pump unit to control a revolution per minute (RPM) of the pump unit to control a flow rate of the chemical liquid to be supplied to the substrate treating apparatus through the chemical liquid circulating line,
wherein the pump unit includes a rotatable impeller disposed therein,
wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid.

2. The chemical liquid supply module of claim 1, wherein the pump unit is embodied as a magnetic levitation-type pump configured to rotate the impeller in a non-contact manner under a magnetic force.

3. The chemical liquid supply module of claim 2, wherein the pump unit includes:
a pump housing installed at the chemical liquid circulating line, wherein the chemical liquid flows in the pump housing;
the impeller received inside the pump housing and supported and suspended in a non-contact manner at a center of the pump housing under the magnetic force; and
a motor driver including a stator installed on the pump housing and a rotor installed in the impeller and spaced apart from the stator, wherein the impeller rotates in a non-contact manner under the magnetic field generated between the stator and the rotor.

4. The chemical liquid supply module of claim 3, wherein the controller is configured to:
calculate the RPM of the impeller capable of heating the chemical liquid to the predetermined heating temperature, based on the predetermined heating temperature input thereto; and
apply a control signal to the motor driver to generate the magnetic field between the stator and the rotor based on the calculated RPM.

5. The chemical liquid supply module of claim 1, wherein the chemical liquid supply module further comprises a bypass line branching from the chemical liquid circulating line and extending to the chemical liquid tank, wherein a portion of the chemical liquid flowing through the chemical liquid circulating line flows through the bypass line to the chemical liquid tank such that a flow rate of the chemical liquid circulating through the chemical liquid circulating line is kept constant.

6. The chemical liquid supply module of claim 5, wherein the bypass line branches from a position of the chemical liquid circulating line downstream of the pump unit in a flow direction of the chemical liquid circulating through the chemical liquid circulating line.

7. The chemical liquid supply module of claim 5, wherein a relief valve is installed at the bypass line at a branching position thereof at which the bypass line branches from the chemical liquid circulating line,
wherein when a flow rate of the chemical liquid circulating through the chemical liquid circulating line exceeds a predetermined circulation flow rate, the relief valve is configured to selectively open the bypass line such that at least a portion of the chemical liquid flowing in the chemical liquid circulating line flows through the bypass line to the chemical liquid tank.

8. The chemical liquid supply module of claim 5, wherein a flow rate control valve is installed at the bypass line at a branching position thereof at which the bypass line branches from the chemical liquid circulating line, wherein the flow rate control valve is configured to control a flow rate of a portion of the chemical liquid flowing through the bypass line to the chemical liquid tank such that a flow rate of the chemical liquid circulating through the chemical liquid circulating line is kept constant at a predetermined circulation flow rate.

9. The chemical liquid supply module of claim 8, wherein the chemical liquid circulating line includes:

a temperature sensor installed at the chemical liquid circulating line to measure a temperature of the chemical liquid circulating through the chemical liquid circulating line;

a pressure sensor installed at the chemical liquid circulating line to measure a pressure of the chemical liquid circulating through the chemical liquid circulating line; and a flow rate sensor installed at the chemical liquid circulating line to measure a flow rate of the chemical liquid circulating through the chemical liquid circulating line.

10. The chemical liquid supply module of claim 9, wherein the chemical liquid circulating line further includes:

a filter installed in the chemical liquid circulating line to remove foreign substances contained in the chemical liquid circulating through the chemical liquid circulating line; and a bubble cutter installed in the chemical liquid circulating line to remove air bubbles contained in the chemical liquid circulating through the chemical liquid circulating line.

11. The chemical liquid supply module of claim 9, wherein the temperature sensor is installed at a position of the chemical liquid circulating line positioned between the pump unit and a branching position at which the bypass line branches from the chemical liquid circulating line, such that the temperature sensor is positioned downstream of the pump unit in a flow direction of the chemical liquid circulating through the chemical liquid circulating line.

12. The chemical liquid supply module of claim 9, wherein the controller is configured to fully open the flow rate control valve until the temperature of the chemical liquid sensed by the temperature sensor reaches the predetermined heating temperature, such that an entire amount of the chemical liquid is collected through the bypass line into the chemical liquid tank until the chemical liquid is heated to the predetermined heating temperature, during an initial operation of the pump unit.

13. The chemical liquid supply module of claim 9, wherein the controller is configured to apply a control signal to the pump unit during an operation of the pump unit so as to:

increase the RPM of the impeller in response to that the temperature of the chemical liquid sensed by the temperature sensor falls below the predetermined heating temperature; or decrease the RPM of the impeller in response to that the temperature of the chemical liquid exceeds the predetermined heating temperature.

14. The chemical liquid supply module of claim 13, wherein the controller is configured to apply a control signal to the flow rate control valve so as to:

increase an opening amount of the flow rate control valve in response to that the flow rate of the chemical liquid sensed by the flow rate sensor exceeds the predetermined circulation flow rate due to increase in the RPM of the impeller; or decrease the opening amount of the flow rate control valve or close the flow rate control valve in response to that the flow rate of the chemical liquid sensed by the flow rate sensor falls below the predetermined circulating flow rate due to decrease in the RPM of the impeller.

15. The chemical liquid supply module of claim 5, wherein the chemical liquid supply module further comprises an auxiliary heater installed on the chemical liquid circulating line to heat the chemical liquid circulating through the chemical liquid circulating line.

16. The chemical liquid supply module of claim 15, wherein the controller is configured to apply a control signal to the auxiliary heater to heat the chemical liquid until the chemical liquid is heated to the predetermined heating temperature during an initial operation of the pump unit.

17. The chemical liquid supply module of claim 1, wherein the chemical liquid supply module further comprises a gas discharger connected to the chemical liquid tank and configured to discharge an inert gas into the receiving space so as to reduce a content of dissolved oxygen in the chemical liquid received in the receiving space of the chemical liquid tank.

18. The chemical liquid supply module of claim 1, wherein the chemical liquid supply module further comprises a chemical liquid supply line connected to an external chemical liquid supply source and the chemical liquid tank to supply the chemical liquid from the external chemical liquid supply source to the receiving space of the chemical liquid tank.

19. A substrate treating apparatus comprising:

a chamber having a treating space defined therein in which a substrate treating process is performed;

a substrate support unit installed in the treating space and configured to rotatably support the substrate;

a chemical liquid spray unit installed in the treating space so as to be located on top of the substrate support unit, wherein the chemical liquid spray unit is configured to spray at least one type chemical liquid onto the substrate through a spray nozzle;

a chemical liquid supply module configured to supply the chemical liquid to the chemical liquid spray unit; and a collection unit installed in the treating space and formed in a cylindrical shape with an open top so as to surround the substrate support unit, wherein the collection unit is configured to collect the chemical liquid scattering from the substrate when the substrate rotates, wherein the chemical liquid supply module includes:

a chemical liquid tank having a receiving space defined therein capable of receiving therein chemical liquid;

a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank;

a pump unit installed at the chemical liquid circulating line and configured to control a flow rate and a pressure of the chemical liquid flowing in the chemical liquid circulating line; and a controller configured to apply a control signal to the pump unit to control a revolution per minute (RPM) of the pump unit to control a flow rate of the chemical liquid to be supplied to the substrate treating apparatus through the chemical liquid circulating line, wherein the pump unit includes a rotatable impeller disposed therein, wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid.

20. A chemical liquid supply module comprising:

a chemical liquid tank having a receiving space defined therein capable of receiving therein chemical liquid;

a chemical liquid circulating line for supplying the chemical liquid contained in the chemical liquid tank to a chemical liquid spray unit of a substrate treating apparatus and for recirculating a remaining portion of the chemical liquid not supplied to the substrate treating apparatus to the chemical liquid tank;

a pump unit installed at the chemical liquid circulating line and configured to control a flow rate and a pressure of the chemical liquid flowing in the chemical liquid circulating line;

a bypass line branching from the chemical liquid circulating line and extending to the chemical liquid tank, wherein a portion of the chemical liquid flowing through the chemical liquid circulating line flows through the bypass line to the chemical liquid tank such that a flow rate of the chemical liquid circulating through the chemical liquid circulating line is kept constant, wherein the bypass line branches from a position of the chemical liquid circulating line downstream of the pump unit in a flow direction of the chemical liquid circulating through the chemical liquid circulating line; and a controller configured to apply a control signal to the pump unit to control a revolution per minute (RPM) of the pump unit to control a flow rate of the chemical liquid to be supplied to the substrate treating apparatus through the chemical liquid circulating line, wherein the pump unit is embodied as a magnetic levitation-type pump configured to rotate the impeller in a non-contact manner under a magnetic force, wherein the pump unit includes:

a pump housing installed at the chemical liquid circulating line, wherein the chemical liquid flows in the pump housing;

the impeller received inside the pump housing and supported and suspended in a non-contact manner at a center of the pump housing under the magnetic force; and a motor driver including a stator installed on the pump housing and a rotor installed in the impeller and spaced apart from the stator, wherein the impeller rotates in a non-contact manner under the magnetic field generated between the stator and the rotor, wherein the controller is configured to vary the RPM of the impeller based on a predetermined heating temperature such that the chemical liquid to be supplied to the substrate treating apparatus through the chemical liquid circulating line is heated to the predetermined heating temperature, using friction heat generated from friction between the impeller rotating in the pump unit and the chemical liquid, wherein the controller is configured to:

calculate the RPM of the impeller capable of heating the chemical liquid to the predetermined heating temperature, based on the predetermined heating temperature input thereto; and apply a control signal to the motor driver to generate the magnetic field between the stator and the rotor based on the calculated RPM.

* * * * *